(12) United States Patent
Lim et al.

(10) Patent No.: US 8,451,342 B2
(45) Date of Patent: May 28, 2013

(54) COUNTER CIRCUIT, ANALOG-TO-DIGITAL CONVERTER (ADC) INCLUDING A COUNTER CIRCUIT, IMAGE SENSOR INCLUDING COUNTER CIRCUIT AND/OR ADC, SYSTEMS ASSOCIATED THEREWITH, AND METHOD ASSOCIATED THEREWITH

(75) Inventors: Yong Lim, Hwaseong-si (KR); Chi Ho Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 303 days.

(21) Appl. No.: 12/944,029

(22) Filed: Nov. 11, 2010

(65) Prior Publication Data

US 2012/0033097 A1 Feb. 9, 2012

(30) Foreign Application Priority Data

Aug. 6, 2010 (KR) ........................ 10-2010-0075997

(51) Int. Cl.
*H04N 5/235* (2006.01)
*H04N 5/225* (2006.01)
*H03M 1/12* (2006.01)

(52) U.S. Cl.
USPC .................... 348/222.1; 348/207.99; 341/155

(58) Field of Classification Search
USPC ....... 348/222.1, 241, 294, 300, 308; 341/155; 377/39
See application file for complete search history.

(56) References Cited

U.S. PATENT DOCUMENTS

| | | | |
|---|---|---|---|
| 7,495,597 B2* | 2/2009 | Muramatsu et al. | 341/164 |
| 2009/0167915 A1* | 7/2009 | Hirota et al. | 348/302 |
| 2009/0295959 A1* | 12/2009 | Shoho et al. | 348/294 |
| 2010/0271519 A1* | 10/2010 | Ui et al. | 348/302 |
| 2010/0321547 A1* | 12/2010 | Morikawa et al. | 348/294 |

* cited by examiner

*Primary Examiner* — Trung Diep
(74) *Attorney, Agent, or Firm* — Harness, Dickey & Pierce

(57) ABSTRACT

In one embodiment, the counter circuit is associated with a pixel array and includes a plurality of counting circuits. Each counting circuit is configured to receive an associated input signal, and each input signal is associated with a different column of the pixel array. A first of the plurality of counting circuits is configured to count based on the associated input signal. Each subsequent counting circuit in the plurality of counting circuits is configured to count based on a difference between the associated input signal and the input signal associated with a preceding counting circuit.

30 Claims, 14 Drawing Sheets

US 8,451,342 B2

COUNTER CIRCUIT, ANALOG-TO-DIGITAL CONVERTER (ADC) INCLUDING A COUNTER CIRCUIT, IMAGE SENSOR INCLUDING COUNTER CIRCUIT AND/OR ADC, SYSTEMS ASSOCIATED THEREWITH, AND METHOD ASSOCIATED THEREWITH

CROSS-REFERENCE TO RELATED APPLICATIONS

This application claims the benefit of Korean Patent Application No. 10-2010-0075997 filed on Aug. 6, 2010, in the Korean Intellectual Property Office, the disclosure of which is incorporated herein in its entirety by reference.

BACKGROUND

The present invention relates to a data processing method and device and a recording medium, and more particularly, to a method and device for reducing power consumption of a counter and a recording medium.

Image sensors capture images using the characteristic of semiconductor reacting to light. With the recent development of complementary metal-oxide semiconductor (CMOS) technology, CMOS image sensors using CMOS are widely used.

CMOS image sensors use correlated double sampling (CDS), count a result of CDS, e.g., a difference between a reset signal and an image signal, and output a digital signal. At this time, power is consumed during a counting period. This power consumption needs to be reduced in order to realize high-definition high-speed CMOS image sensors.

SUMMARY

The present invention is related to a counter circuit, an analog-to-digital converter (ADC) including a counter circuit, an image sensor including a counter circuit and/or ADC, a system including a counter circuit, an ADC and/or an image sensor, and methods associated with any of these devices.

In one embodiment, the counter circuit is associated with a pixel array and includes a plurality of counting circuits. Each counting circuit is configured to receive an associated input signal, and each input signal is associated with a different column of the pixel array. A first of the plurality of counting circuits is configured to count based on the associated input signal. Each subsequent counting circuit in the plurality of counting circuits is configured to count based on a difference between the associated input signal and the input signal associated with a preceding counting circuit.

For example, in one embodiment, the first of the plurality of counting circuits includes a first counter counting based on the associated input signal. Each subsequent counting circuit includes a difference circuit configured to identify a difference between the associated input signal and the input signal associated with the preceding counting circuit, and a second counter configured to count based on output of the difference circuit.

In another embodiment, each subsequent counting circuit includes a count direction determining circuit configured to control whether the second counter counts up or down based on the associated input signal and the output of the difference circuit.

In one embodiment, the analog-to-digital converter (ADC) is associated with a pixel array having pixels arranged in a plurality of columns, and the ADC includes a counter circuit. The counter circuit is configured to receive input signals, and each of the input signals is associated with a different one of the plurality of columns. The counter circuit is configured to generate a count value associated with each input signal during first and second read operations. The first read operation reads reset states for the plurality of columns, and the second read operation reads image signals from the plurality of columns. The counter circuit is configured such that at least one count value associated with one of the plurality of columns represents a difference between a digital value representing the received input signal for the associated column and a digital value representing the received input signal for one of the plurality of columns adjacent to the associated column.

In one embodiment of the ADC, the counter circuit is configured to receive a mode signal indicating whether an operation mode is one of the first read operation and the second read operation, and the counter circuit is configured to one of count up and count down based on the mode signal.

In another embodiment, the ADC is associated with a pixel array having pixels arranged in a plurality of columns, and the ADC includes a comparator circuit configured to generate comparison signals associated with the plurality of columns by comparing output from the plurality of columns to a ramp signal during a first read operation and during a second read operation. The first read operation reads reset states for the plurality of columns, and the second read operation reads image signals from the plurality of columns. The ADC also includes a counter circuit configured to generate a count value associated with each comparison signal during the first and second read operations such that at least one count value associated with one of the plurality of columns represents a difference between a digital value representing the associated comparison signal for the associated column and a digital value representing the comparison signal for one of the plurality of columns adjacent to the associated column.

In one embodiment, the comparator circuit includes a plurality of comparators, each associated with a different one of the plurality of columns. Each of the plurality of comparators is configured to generate one of the comparison signals by comparing output from the associated column with the ramp signal during the first read operation and during the second read operation. The counter circuit includes a plurality of counting circuits. Each counting circuit is associated with a different one of the plurality of columns and is configured to receive the comparison signal corresponding to the associated column. A first of the plurality of counting circuits is configured to count based on the associated comparison signal, and each subsequent counting circuit in the plurality of counting circuits is configured to count based on a difference between the associated comparison signal and the comparison signal associated with a preceding counting circuit.

In yet another embodiment, the ADC is associated with a pixel array having pixels arranged in a plurality of columns, and the ADC includes a comparator circuit configured to generate comparison signals associated with the plurality of columns by comparing output from the plurality of columns to a ramp signal during a first read operation and during a second read operation. The first read operation reads reset states for the plurality of columns, and the second read operation reads image signals from the plurality of columns. The ADC further includes a counter circuit including a plurality of counting circuits. Each counting circuit is associated with a different one of the plurality of columns and is configured to receive the comparison signal corresponding to the associated column. The counter circuit is configured to enable at least one of the counting circuits to count a difference between the comparison signal corresponding to the associated column and the comparison signal corresponding to a column adjacent to the associated column.

In one embodiment, an image sensor includes a pixel array having pixels arranged in a plurality of columns, and a comparator circuit configured to generate comparison signals associated with the plurality of columns by comparing output from the plurality of columns to a ramp signal during a first read operation and during a second read operation. The first read operation reads reset states for the plurality of columns, and the second read operation reads image signals from the plurality of columns. The image sensor further includes a counter circuit including a plurality of counting circuits. Each counting circuit is associated with a different one of the plurality of columns and is configured to receive the comparison signal corresponding to the associated column. The counter circuit is configured to enable at least one of the counting circuits to count a difference between the comparison signal corresponding to the associated column and the comparison signal corresponding to a column adjacent to the associated column.

In one embodiment, the system includes an image sensor according to one of the above described embodiment. The system further includes an image processor configured to control operation of the image sensor and configured to process output from the image sensor.

One embodiment of the methods includes a method of reading information from a pixel array. This method includes generating, by the pixel array, a plurality of information signals, each information signal associated with a different column of the pixel array. The method further includes counting based on the information signal associated with a first column, and counting based on a difference between the information signal associated with the first column and the information signal associated with a second column.

Another embodiment of the methods includes a method of analog-to-digital conversion (ADC). This method includes generating, by the pixel array, a plurality of information signals, each information signal associated with a different column of the pixel array; and generating a count value associated with each information signal during first and second read operations. The first read operation reads reset states for the plurality of columns, and the second read operation reads image signals from the plurality of columns. At least one count value associated with one of the plurality of columns represents a difference between a digital value representing the received input signal for the associated column and a digital value representing the received input signal for one of the plurality of columns adjacent to the associated column.

One embodiment of the methods includes another method of analog-to-digital conversion (ADC). This method includes generating, by the pixel array, a plurality of information signals, each information signal associated with a different column of the pixel array; and generating comparison signals associated with the plurality of columns by comparing output from the plurality of columns to a ramp signal during a first read operation and during a second read operation. The first read operation reads reset states for the plurality of columns, and the second read operation reads image signals from the plurality of columns. The method also includes receiving the comparison signals at a plurality of counting circuits. Each counting circuit is associated with a different one of the plurality of columns such that each counting circuit receives the comparison signal corresponding to the associated column. The method further includes enabling at least one of the counting circuits to count a difference between the comparison signal corresponding to the associated column and the comparison signal corresponding to a column adjacent to the associated column.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

Figure 1A:
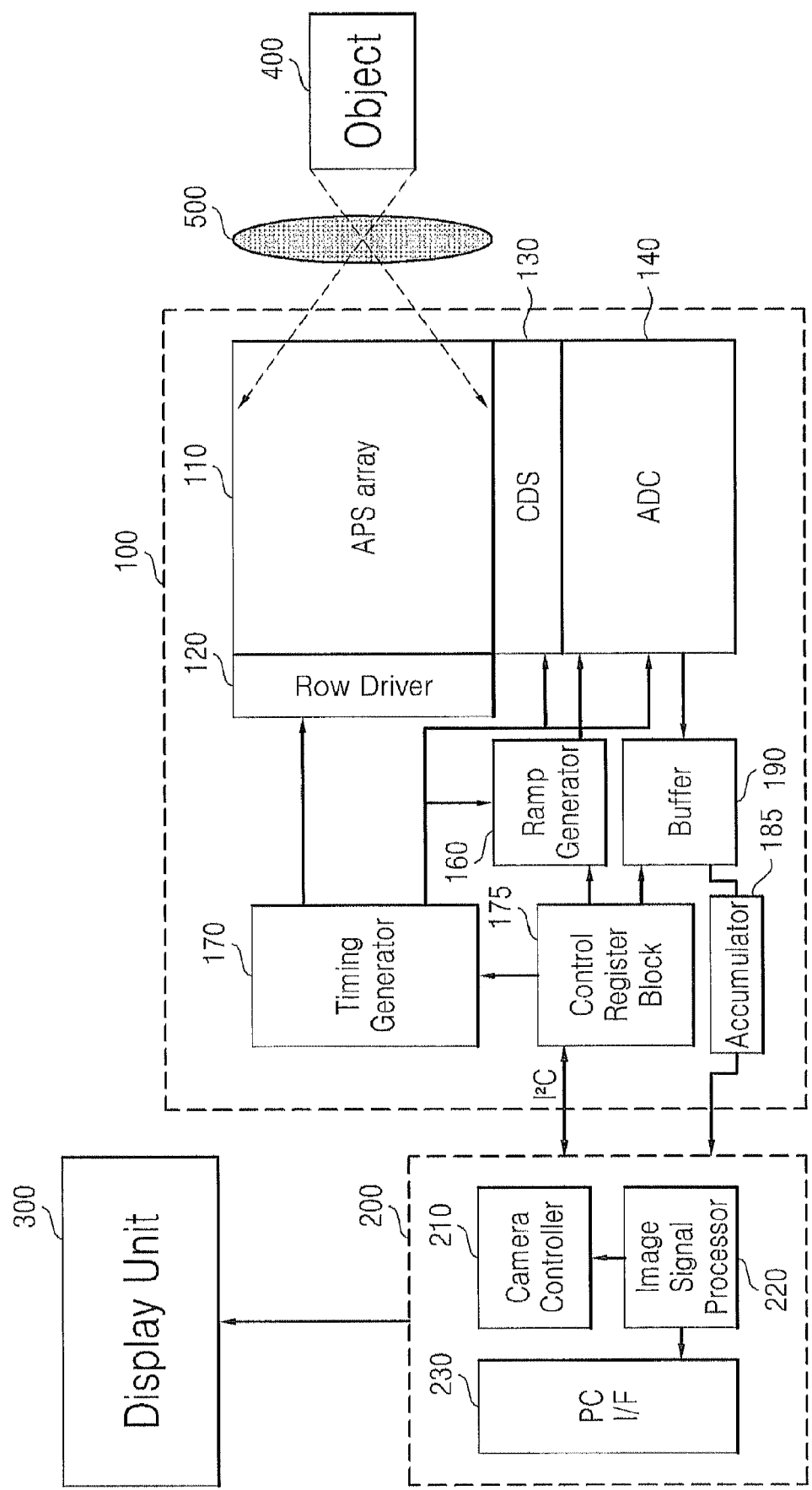
FIG. 1A is a schematic block diagram for explaining an image sensor according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly faunal sense unless expressly so defined herein.

FIG. 1A is a schematic block diagram for explaining an image sensor 100 according to some embodiments of the present invention. Referring to FIG. 1A, the image sensor 100 includes a pixel array (e.g., an active-pixel sensor (APS) array) 110, a row driver 120, a correlated double sampling (CDS) block 130, an analog-to-digital converter (ADC) 140, a ramp generator 160, a timing generator 170, a control register block 175, an accumulator 185, and a buffer 190.

The image sensor 100 is controlled by an image processor (e.g., a digital image processor (DSP)) 200 to sense an object 400 picked up through a lens 500, and the image processor 200 outputs an image sensed and output by the image sensor 100 to a display unit 300. At this time, the display unit 300 may be any device that can output an image. For instance, the display unit 300 may be a computer, a mobile phone, or any type of image display terminal.

The image processor 200 includes a camera control or controller 210, an image signal processor 220, and a personal computer (PC) interface (I/F) 230. The camera controller 210 controls the control register block 175. The camera controller 210 may control the image sensor 100, and more specifically, the control register block 175 through communication according to the inter-integrated circuit (I²C) protocol or CSI protocol, but the present invention is not restricted thereto.

The image signal processor 220 receives image data, i.e., an output signal of the buffer 190 (e.g., according to the CSI protocol), processes the image data so that people can see an image, and outputs the image to the display unit 300 through PC I/F 230. The image signal processor 220 is disposed within the image processor 200 in the embodiments illustrated in FIG. 1, but the design may be modified by those skilled in the art. For instance, the image signal processor 220 may be disposed within the image sensor 100.

The pixel array 110 includes a plurality of photo sensitive devices, for example, photo diodes or pinned photo diodes. The pixel array 110 senses light using the photo sensitive devices and converts the light into an electrical signal, i.e., an image signal.

The timing generator 170 outputs a control signal to the row driver 120, the ADC 140, and the ramp generator 160 to control the operations thereof. The control register block 175 outputs a control signal to the ramp generator 160, the timing generator 170, and the buffer 190 to control the operations thereof. The control register block 175 is controlled by the camera control 210.

The row driver 120 drives the pixel array 110 in units of rows. For instance, the row driver 120 may generate a row selection signal. The pixel array 110 outputs to the CDS block 130 a reset signal and the image signal from a row selected by the row selection signal received from the row driver 120. The CDS block 130 performs CDS on the reset signal and the image signal.

The ADC 140 compares a ramp signal Vramp output from the ramp generator 160 with a CDS signal output from the CDS block 130, generates and counts a comparison result signal, and outputs it to the buffer 190.

The buffer 190 temporarily stores a digital signal output from the ADC 130 and senses and amplifies the digital signal before outputting it. The buffer 190 may include a column memory block including a plurality of memories, e.g., static random access memories (SRAMs), each of which is for each column, for temporal storing and a sense amplifier sensing and amplifying the digital signal received from the ADC 130.

The accumulator 185 accumulates an output of the buffer 190 as embodiments of the present invention employ data difference counting as will be explained below. In detail, in some embodiments the ADC 140 counts a signal difference for each column, and therefore, a signal output from the buffer 190 corresponds to the signal difference for each column. Accordingly, to restore an original image, the accumulator 185 accumulates signal differences for all columns and outputs restored data. As described above, however, when the image signal processor 220 is disposed within the image sensor 100, it may be designed that the accumulation is performed by the image signal processor 220, so that the accumulator 185 may not be included in the image sensor 100.

Figure 1B:
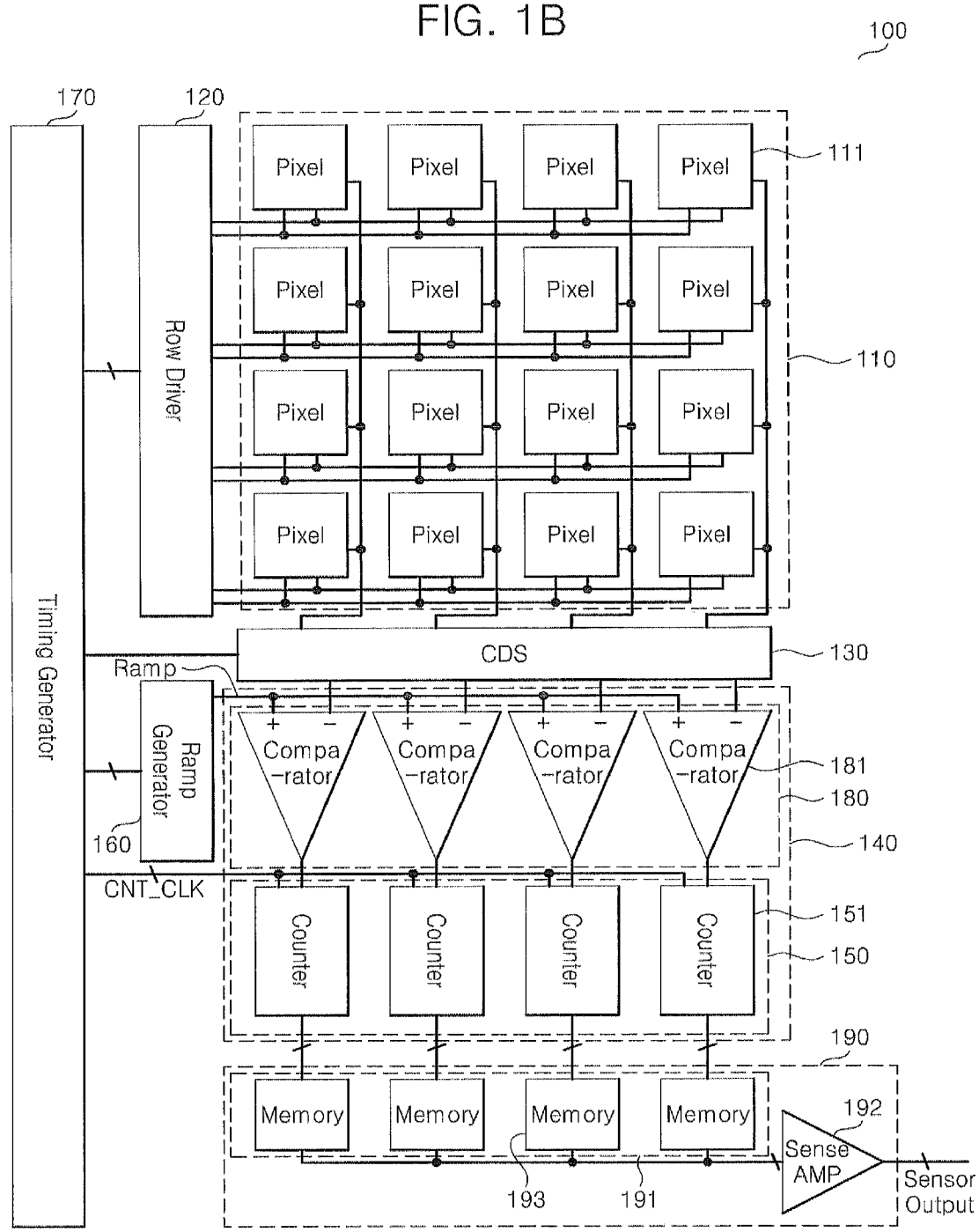
FIG. 1B is a diagram of an image sensor according to some embodiments of the present invention.

FIG. 1B is a diagram of the image sensor 100 according to some embodiments of the present invention. Referring to FIG. 1B, the image sensor 100 includes the pixel array 110, the row driver 120, the CDS block 130, the ADC 140, the ramp generator 160, the timing generator 170, and the buffer 190. In this embodiment, the ADC 140 includes a comparator block 180 and a counter block 150.

The pixel array 110 includes a plurality of pixels 111 arranged in a matrix form. The pixels 111 are connected to a plurality of row lines and a plurality of column lines. The pixels 111 may include a red pixel converting red spectrum light into an electrical signal, a green pixel converting green spectrum light into an electrical signal, and a blue pixel converting blue spectrum light into an electrical signal. In addition, a color filter array may be disposed above the pixel array 110 such that a color filter transmitting light with a particular color spectrum is positioned above each of the pixels 111.

The row driver 120 decodes a row control signal (e.g., an address signal) generated by the timing generator 170 and selects at least one row line from among the plurality of row lines included in the pixel array 110 in response to the decoded row control signal. The CDS block 130 performs CDS of a pixel signal output from a pixel 111 connected to one of the column lines included in the pixel array 110.

The comparator block 180 includes a plurality of comparators 181. Each comparator 181 is connected to the CDS block 130 and the ramp generator 160. The CDS block 130 is connected to a first input terminal of each comparator 181 and the ramp generator 160 is connected to a second input terminal of each comparator 181.

Each comparator 181 is associated with a different column of pixels 111, and receives an output signal of the CDS block 130 and a ramp signal Ramp generated by the ramp generator 160, compares the two received signals with each other, and outputs a comparison result signal to an output terminal. The comparison result signal output from a comparator 181 may correspond over time to a difference between a reset signal and an image signal changing according to the illumination of external light. This will be described in more detail below. The ramp signal Ramp may be used to output the difference between the image signal and the reset signal such that the difference therebetween is detected and output according to the slope of the ramp signal Ramp. The ramp generator 160 may operate based on a control signal generated by the timing generator 170.

The counter block 150 includes a plurality of counters 151. Each counter 151 is connected to the output terminal of a respective comparator 181 and counts the comparison result signal based on a clock signal CNT_CLK received from the timing generator 170 to output a digital signal. The clock signal CNT_CLK may be generated by a counter controller (not shown) positioned within the counter block 150 or the timing generator 170 based on a counter control signal generated by the timing generator 170.

The counter 151 may include an up/down counter or a bit-wise inversion counter. The bit-wise inversion counter may perform a similar operation to the up/down counter. For instance, the bit-wise inversion counter can not only count up but also invert all bits in the counter to convert them into 1's complement when a particular signal is received. Accordingly, after obtaining bits according to a reset count, the bit-wise inversion counter can convert the bits into the 1's complement, i.e., a negative value.

The buffer 190 includes a column memory block 191 and a sense amplifier 192. The column memory block 191 includes a plurality of memories 193. Each memory 193 is associated with one of the counters 151, and may operate according to a memory control signal generated by a memory controller (not shown) positioned within the column memory block 191 or the timing generator 170 based on a control signal generated by the timing generator 170. The memory 193 may be static random access memory (SRAM).

The column memory block 191 temporarily stores a digital signal output from each counter 151 and then supplies output to the sense amplifier 192 in response to the memory control signal. The sense amplifier 192 senses and amplifies the digital signal.

Figure 2:
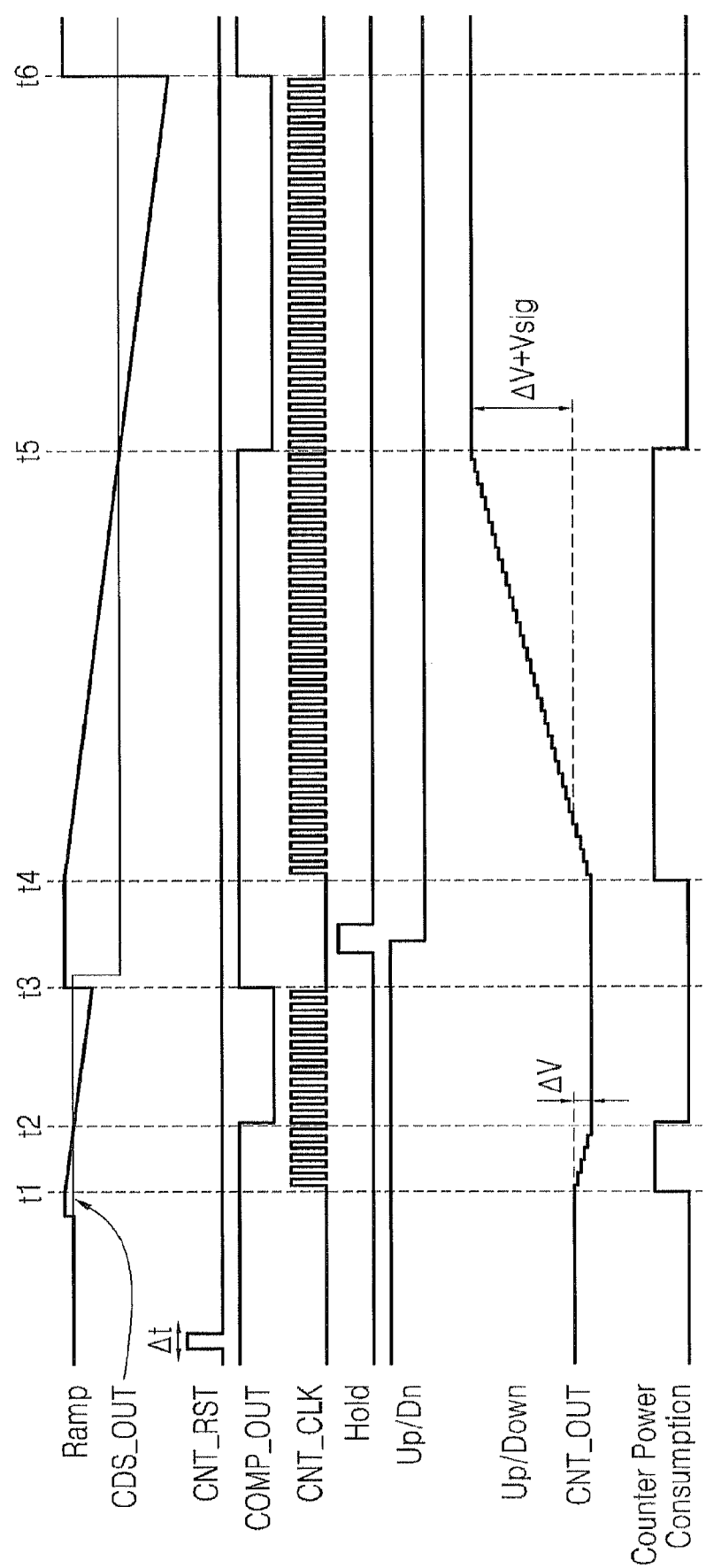
FIG. 2 is a diagram showing waveforms of main signals to explain the operation of an analog-to-digital converter (ADC) according to some embodiments of the present invention.

FIG. 2 is a diagram showing waveforms of main signals to explain the operation of the ADC 140 according to some embodiments of the present invention. For the purpose of explanation only, operation of a single comparator 181 and counter 151 pair will be described. However, it will be understood that this description applies to the other comparator 181 and counter 151 pairs. When the ADC 140 converts an analog pixel signal detected by each pixel 111 of the pixel array 110 into a digital signal, a value of the ramp signal Ramp decreasing with a desired (or, alternatively a predetermined) slope may be compared with a value of the pixel signal from the pixel 111. In detail, counting is performed starting from a first point "t1" at which the ramp signal Ramp is generated (or a decrease start point) till a second point "t2" at which the ramp signal Ramp and the pixel signal have the same value to obtain a count value corresponding to the magnitude of the pixel signal. Here, the pixel signal is output from a column line and includes a reset component ΔV.

Referring to FIG. 2, during a first read operation, a reset control signal CNT_RST from the timing generator 170 is activated (for example, at a high level) during a desired (or, alternatively a predetermined) period Δt to reset a count value of the counter block 150 to an initial value. A voltage of the ramp signal Ramp generated by the ramp generator 160 is input to each comparator 181. The comparator 181 compares the voltage of the ramp signal Ramp with a voltage of an output signal CDS_OUT (e.g., a pixel signal) of the CDS block 130 connected to a column line corresponding to the comparator 181. While the ramp signal Ramp is greater than the output signal CDS_OUT, the comparator 181 generates a high level output value COMP_OUT. This high level output value COMP_OUT enables counting by the associated counter 151 once the ramp signal Ramp starts decreasing at time "t1." Accordingly, the counter 151 starts counting from a first time point "t1." As shown, down counting takes place to calibrate the count value to the reset voltage based on the high level of an up/down control signal from the counter controller.

Tthe comparator 181 inverts an output value COMP_OUT from a high level to a low level starting from the second point "t2" at which the ramp signal Ramp becomes equal to the output signal CDS_OUT of the CDS block 130 and ending at a third point "t3" at which the ramp signal Ramp becomes higher than the output signal CDS_OUT of the CDS block 130. As a result, the counter block 150 stops counting at the second point "t2" at which the output value COMP_OUT of the comparator 181 is inverted and latches as data a count value obtained at that moment. Accordingly, power is consumed by the counter block 150 during a period from the first point "t1" to the second point "t2".

The clock signal CNT_CLK is input to the counter block 150 and toggles starting from the first point "t1" at which the ramp signal Ramp starts decreasing till the third point "t3" corresponding to a decrease end point. In detail, after the third point "t3", the application of the clock signal CNT_CLK to the counter block 150 is interrupted. In other words, down counting of an output value CNT_OUT of the counter block 150 starts at the generation (e.g., the decrease start point) of the ramp signal Ramp, i.e., the first point "t1" so that the clock signal CNT_CLK is counted till the second point "t2" at which the comparator 181 outputs an inverted output signal as a result of comparison. Consequently, a count value corresponding to a reset signal voltage ΔV is obtained.

For the second read operation, the image signal component $V_{sig}$ changing according to the quantity of incident light of each pixel 111 is read in addition to the reset signal voltage ΔV. The second reading is performed in the same manner as the first reading. For the second reading, a signal Hold for holding the count value corresponding to the reset signal voltage ΔV and an up/down control signal Up/Dn for instructing the second reading may be generated by the counter controller and input to the counter block 150. At this time, the up/down control signal Up/Dn, which is inverted from the first read operation is input to the counter block 150.

While the ramp signal Ramp is greater than the output signal CDS_OUT, the comparator 181 generates a high level output value COMP_OUT. This high level output value COMP_OUT enables the associated counter 151 once the ramp signal Ramp starts decreasing at time "t4." Accordingly, the counter 151 starts counting from time "t4." As shown, in response to the low level of the up/down control signal Up/Dn, the counter 151 counts up. The comparator 181 inverts the output value COMP_OUT from the high level to the low level starting from a fifth point "t5" at which the ramp signal Ramp becomes equal to the output signal CDS_OUT of the CDS block 130 and ending at a sixth point "t6" at which the ramp signal Ramp becomes higher than the output signal CDS_OUT of the CDS block 130. At this time, the counter block 150 stops counting at the fifth point "t5" at which the output value COMP_OUT of the comparator 181 is inverted and latches as data a count value obtained at that moment. Accordingly, power is consumed by the counter block 150 during a period from the fourth point "t4" to the fifth point "t5".

The clock signal CNT_CLK is input to the counter block 150 and toggles starting from the fourth point "t4" at which the ramp signal Ramp starts decreasing till the sixth point "t6" corresponding to a decrease end point. In detail, after the sixth point "t6", the application of the clock signal CNT_CLK to the counter block 150 is interrupted. At this time, the sixth point "t6" may be a last point (e.g., a last decrease end point) of the ramp signal Ramp.

In other words, up counting of the output value CNT_OUT of the counter block 150 starts at the generation (e.g., the decrease start point) of the ramp signal Ramp, i.e., the fourth point "t4" so that the clock signal CNT_CLK is counted till the fifth point "t5" at which the comparator block 180 outputs an inverted output signal as a result of comparison. Consequently, a count value corresponding to a reset and image signal voltage $\Delta V + V_{sig}$ is obtained.

The counter block 150 performs down counting for the first reading operation and up counting for the second reading operation. When calculations like "second count value+first count value" are performed in the counter block 150, subtraction is actually performed since the down counting is performed for the first reading operation. A result, the subtraction may be held as an n-bit digital value in the counter block 150. Consequently, the result of the subtraction is a digital value corresponding to "$(\Delta V + V_{sig}) + (-\Delta V) = V_{sig}$". At this time, an offset may be included in the first count value and the second count value, but the offset can be eliminated through the subtraction.

As described above, power is consumed by the counter block 150 during the period between the first point "t1" and the second point "t2" and the period between the fourth point "t4" and the fifth point "t5".

In the above-described embodiments, down counting is performed with respect to a reset signal and up counting is performed with respect to an image signal. It may be vice versa in other embodiments of the present invention.

Figure 3A:
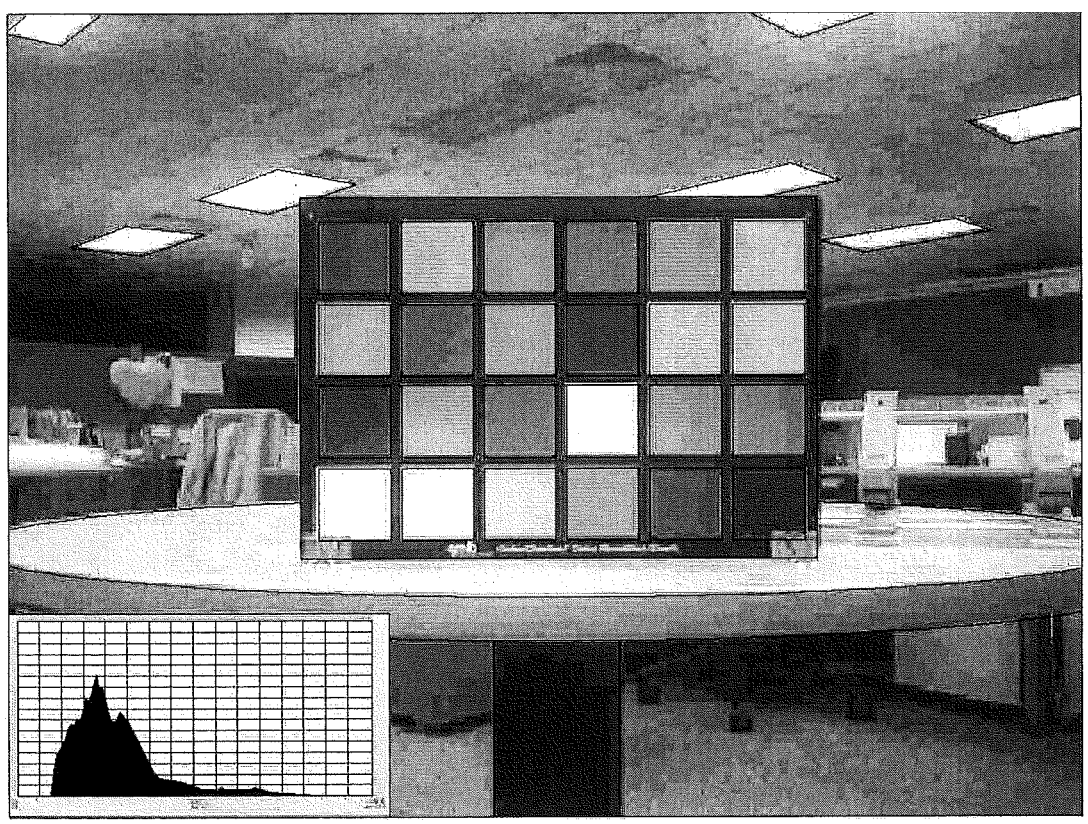
FIGS. 3A and 3B are diagrams for explaining concepts of the present invention.
Figure 3B:
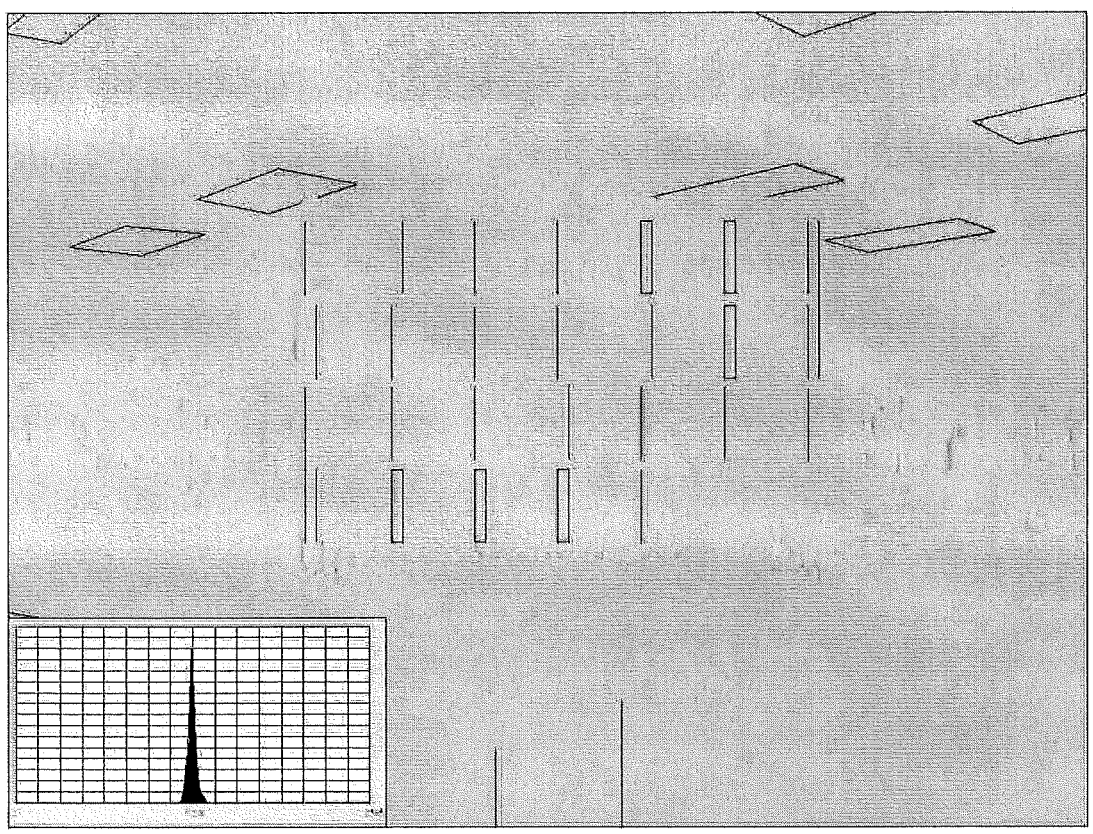

FIGS. 3A and 3B are diagrams for explaining concepts of the present invention. A conventional counter usually counts data output from a pixel and outputs an image. However, according to some embodiments of the present invention, after a first column is read, a counter may be configured to count a difference between data values of two adjacent columns among the other columns, thereby reducing power consumption. Here, the "adjacent" columns may be columns side by side or a predetermined distance, e.g., multiples of a desired (or alternatively a predetermined) integer, away from the other column.

FIG. 3A shows an output image when a conventional counter is used and a graph in which data of each column is represented by 8 bits. FIG. 3B shows an output image when a counter according to some embodiments of the present invention is used and a graph in which data of a first column and data value differences between pairs of adjacent columns are represented by 8 bits. According to the embodiments of the present invention, the counters count smaller data values than the conventional counters, so that the power consumption of the counters is reduced.

Figure 4:
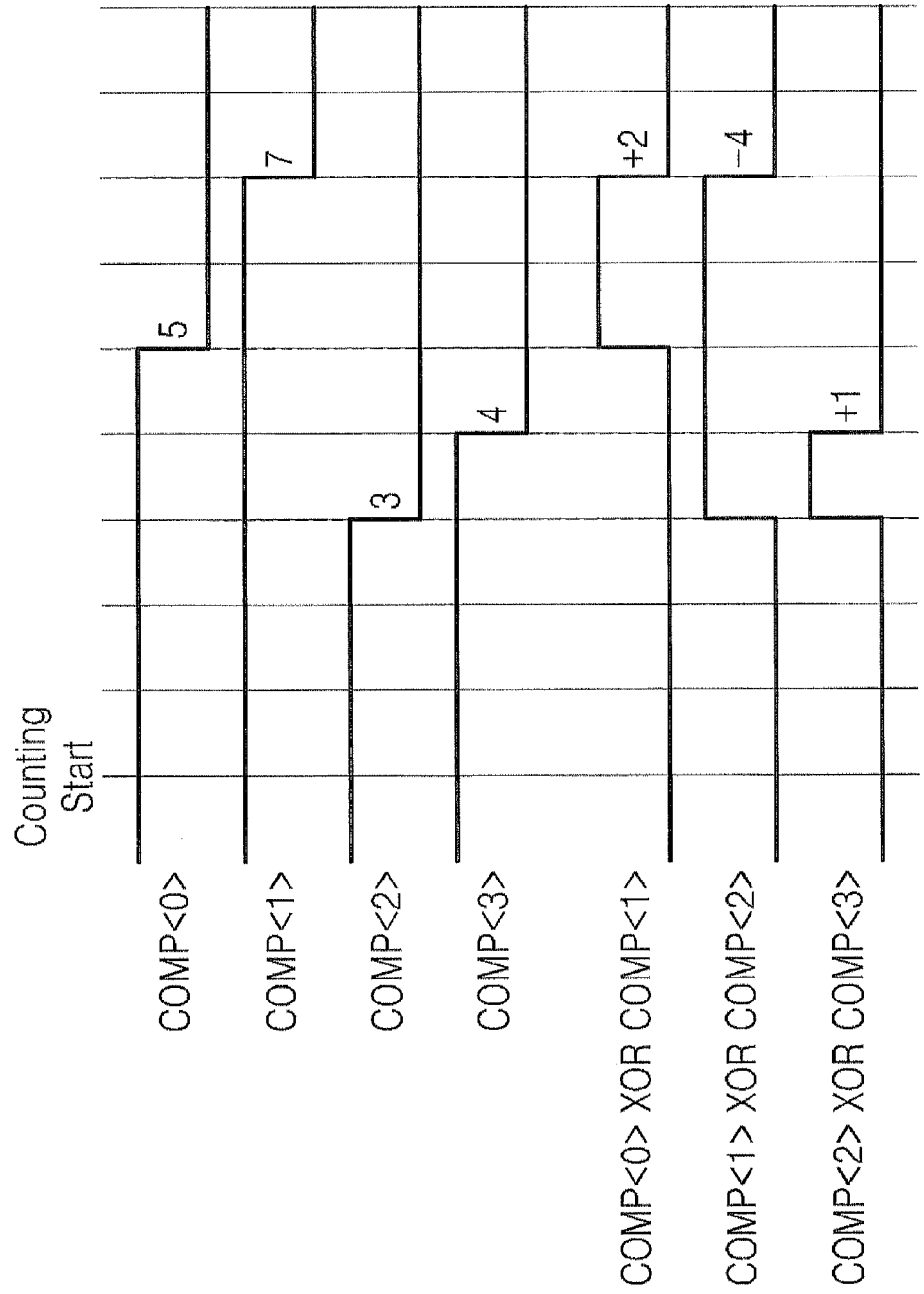
FIG. 4 is a graph illustrating the concept of counting using a data difference according to some embodiments of the present invention.

FIG. 4 is a graph illustrating the concept of counting using data difference according to some embodiments of the present invention. Referring to Table 1 below, when a conventional counter is used, data values are 5, 7, 3, and 4 for first through fourth columns #0 through #3, respectively. According to some embodiments of the present invention, data values for the respective first through fourth columns #0 through #3 are read as 5, 2, −4, and 1, respectively, because after the first column #0 is read, a data value difference between two adjacent columns is read with respect to the other columns. Namely, the difference between the first and second columns #0 and #1 is read, the difference between the second and third columns #1 and #2 is read, and the difference between the third and fourth columns #2 and #3 is read.

As shown in Table 1, when count values obtained according to embodiments of the present invention are sequentially accumulated, the same values, i.e., 5, 7, 3, and 4, as the data values obtained when the conventional counter is used are obtained.

TABLE 1

| Column # | 0 | 1 | 2 | 3 |
|---|---|---|---|---|
| Conventional counter | 5 | 7 | 3 | 4 |
| Difference counter | 5 | 2 | −4 | 1 |
| Reconstruction | = | 5 + 2 | 7 − 4 | 3 + 1 |
|  | 5 | 7 | 3 | 4 |

In detail, referring to FIG. 4, comparator output data COMP<0> through COMP<3> respectively input to counters corresponding to the respective first through fourth columns #0 through #3 have values of 5, 7, 3, and 4. A conventional counter block counts these values as they are. However, according to the embodiments of the present invention, a counter block counts data of only one column (e.g., a first column) and then counts only a data difference between a current column and a previous column using an XOR operation. At this tune, the sign is positive (i.e., "+") when the data of the current column is logic high and is negative (i.e., "−") when the data of the current column is logic low.

For instance, after the data of the first column #0 is counted, then the first column #0 and the second column #1 are XORed for the second column #1, and a value of +2 is obtained through "COMP<0> XOR COMP<1>". When the second column #1 and the third column #2 are XORed for the third column #2, a value of −4 is obtained through "COMP<1> XOR COMP<2>". When the third column #2 and the fourth column #3 are XORed for the fourth column #3, a value of +1 is obtained through "COMP<2> XOR COMP<3>".

Figure 5A:
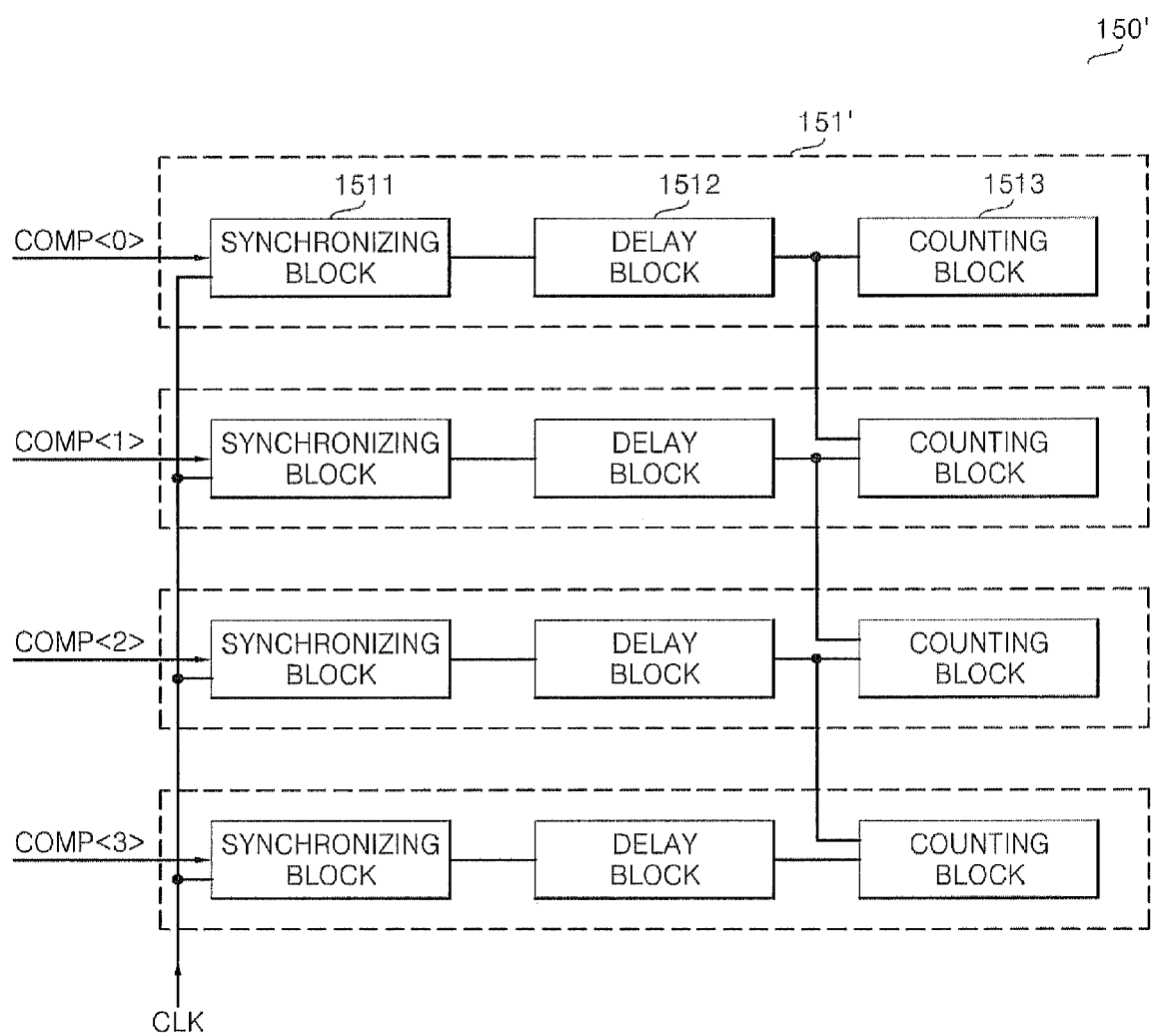
FIG. 5A is a diagram of a counter block counting using data difference counting according to some embodiments of the present invention.

FIG. 5A is a diagram of a counter block counting using data difference counting according to some embodiments of the present invention. The counter block 150' illustrated in FIG. 5A may replace the counter block 150 illustrated in FIG. 1B. Referring to FIG. 5A, each of counters 151' included in the counter block 150' is connected to a corresponding column and includes a synchronizing block 1511, a delay block 1512, and a counting block 1513.

The synchronizing block 1511 receives data COMP<i> output from a comparator connected to the corresponding column and a clock signal CLK and synchronizes the data COMP<i> according to the clock signal CLK. The synchronizing block 1511 may be implemented by a flip-flop, but the present invention is not restricted thereto.

The delay block 1512 receives an output signal of the synchronizing block 1511 and delays the output signal by a desired (or, alternatively a predetermined) number of clock cycles before outputting it. The delay block 1512 may include at least one latch to delay the output signal of the synchronizing block 1511.

Figure 8:
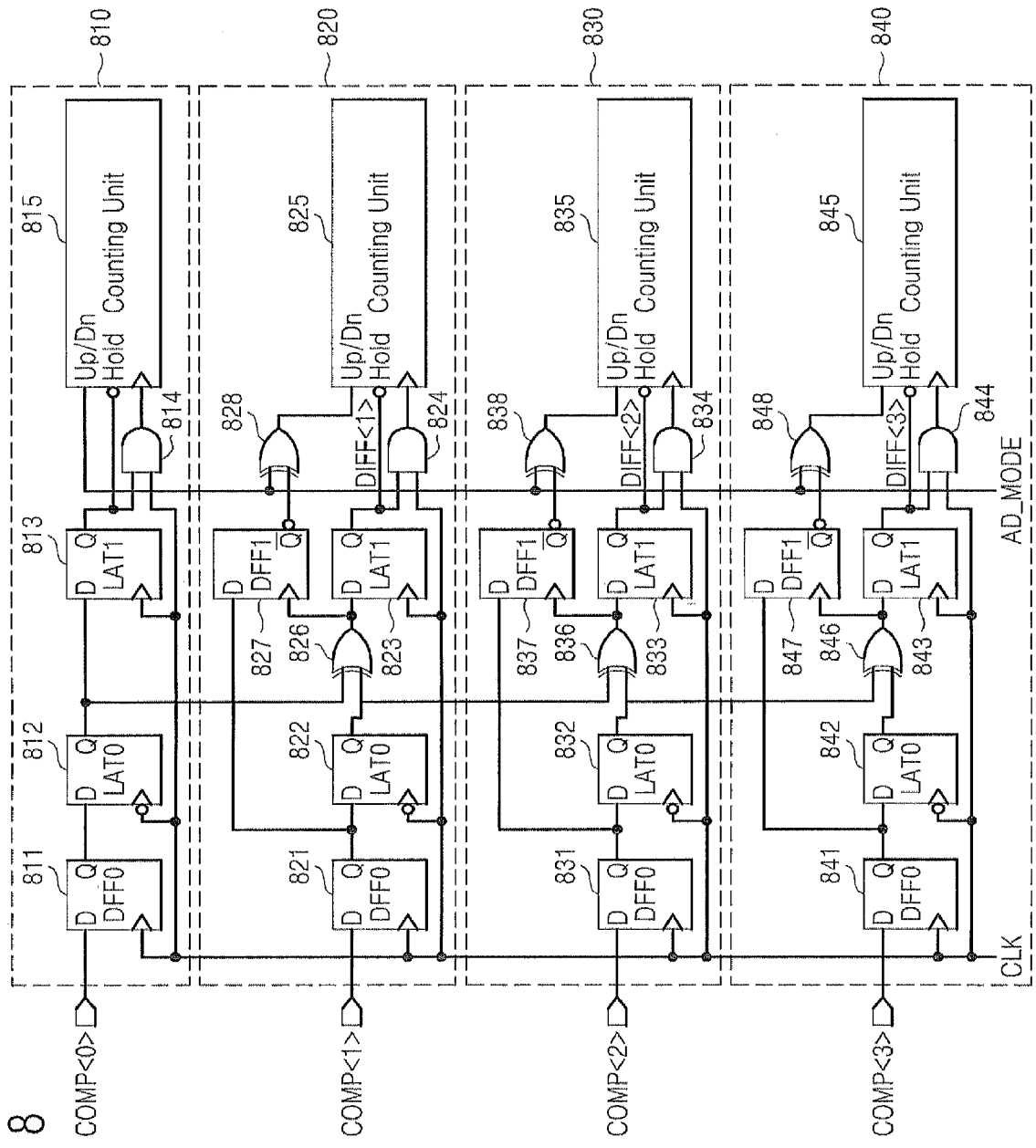
FIG. 8 is a detailed diagram of the counter block illustrated in FIG. 5A according to other embodiments of the present invention.

The counting block 1513 receives an output signal of the delay block 1512 and counts it. At this time, among a plurality of counting blocks 1513 included in the respective counters 151', one counting block (e.g., in the first counter 151') counts the output signal of the delay block 1512 and each of the other counting blocks counts a difference between an output signal of a delay block and a signal received from an adjacent counting block. For this operation, each of the counting blocks may include one or more elements, such as a flip-flop, which detects the signal of a signal, a latch which delays a signal by a desired (or, alternatively a predetermined) number of clock cycles, and a logic gate, which detects a difference between input signals. Examples of the counter block illustrated in FIG. 5A are shown in FIG. 5B and FIG. 8.

Figure 5B:
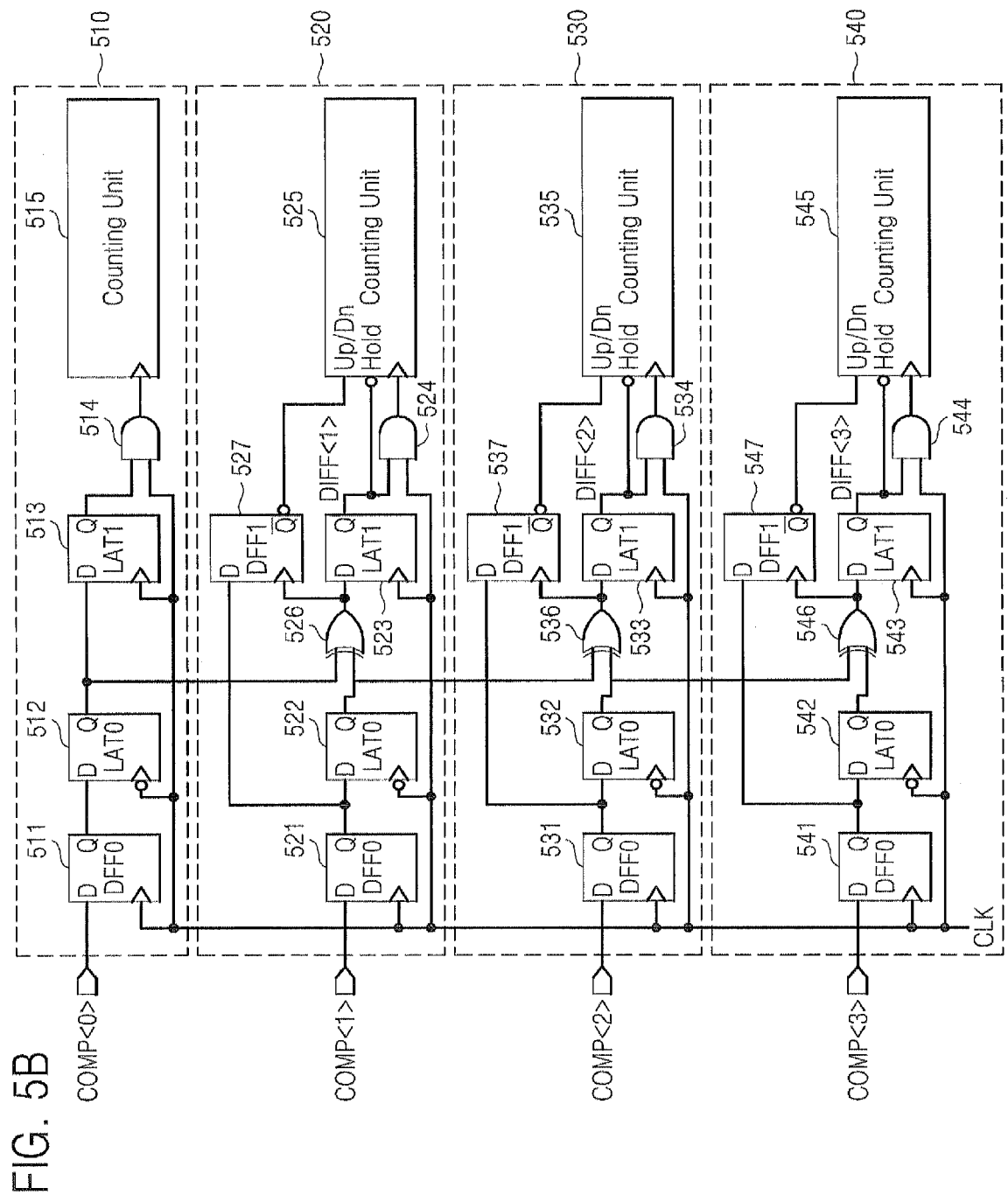
FIG. 5B is a detailed diagram of the counter block illustrated in FIG. 5A according to some embodiments of the present invention.

FIG. 5B is a detailed diagram of the counter block illustrated in FIG. 5A according to some embodiments of the present invention. FIG. 5B shows counters 510 through 540 respectively corresponding to first through fourth columns #0 through #3. The counters 510 through 540 are connected to each other as shown in FIG. 5B.

The counter 510 for the first column #0 includes a first flip-flop 511, a first latch 512, a second latch 513, an AND gate 514, and a counting unit 515. The counter 520 for the second column #1 includes a first flip-flop 521, a first latch 522, a second latch 523, an AND gate 524, a counting unit 525, an XOR gate 526, and a second flip-flop 527. The counter 530 for the third column #2 includes a first flip-flop 531, a first latch 532, a second latch 533, an AND gate 534, a counting unit 535, an XOR gate 536, and a second flip-flop 537. The counter 540 for the fourth column #3 includes a first flip-flop 541, a first latch 542, a second latch 543, an AND gate 544, a counting unit 545, an XOR gate 546, and a second flip-flop 547.

The first flip-flops 511, 521, 531, and 541 respectively receive comparator outputs COMP<0> through COMP<3> input to the respective counters 510, 520, 530, and 540 and respectively synchronize them in the time domain. The second flip-flops 527, 537, and 547 are provided to detect a counting sign. The first latches 512, 522, 532, and 542 and the second latches 513, 523, 533, and 543 delay an input signal by ½ clock cycle, but the present invention is not restricted thereto.

The operations of the counters 510 and 520 respectively for the first and second columns #0 and #1 will only be described since the operations of the counters 520, 530, and 540 respectively for the second through fourth columns #1 through #3 are the same.

The first flip-flops 511 and 521 receive data COMP<0> and COMP<1>, respectively, output from comparators respectively connected to corresponding columns (i.e., the first and second columns #0 and #1) and receive the clock signal CLK. The first flip-flops 511 and 521 respectively synchronize the data COMP<0> and COMP<1> according to the clock signal CLK and the first latches 512 and 522 respectively delay the synchronized data COMP<0> and COMP<1> by ½ clock cycle.

In the counter 510 for the first column #0, the second latch 513 receives an output signal of the first latch 512 and the clock signal CLK, and delays the output signal of the first latch 512 by ½ clock cycle according to the clock signal CLK. The AND gate 514 receives an output signal of the second latch 513 and the clock signal CLK, and outputs the output signal of the second latch 513 when the clock signal CLK is at a logic high, so that the counting unit 515 counts the high value of the output signal of the second latch 513 according to the clock signal CLK.

In the second counter 520 for the second column #1, the XOR gate 526 performs a logic operation on the output signal of the first latch 512 and an output signal of the first latch 522.

The logic operation has been described with reference to FIG. 4 above and will be described again with reference to FIG. 6 later.

The second flip-flop 527 receives the output signal of the first flip-flop 521 and an output signal of the XOR gate 526, detects a counting sign, and outputs the counting sign to the counting unit 525. The second latch 523 receives the output signal of the XOR gate 526 and the clock signal CLK, and delays the output signal of the XOR gate 526 by ½ clock cycle according to the clock signal CLK. The AND gate 524 receives an output signal of the second latch 523 and the clock signal CLK, and outputs the output signal of the second latch 523 when the clock signal CLK is at the logic high, so that the counting unit 525 counts the high value of the output signal of the second latch 523 according to the clock signal CLK.

Figure 6:
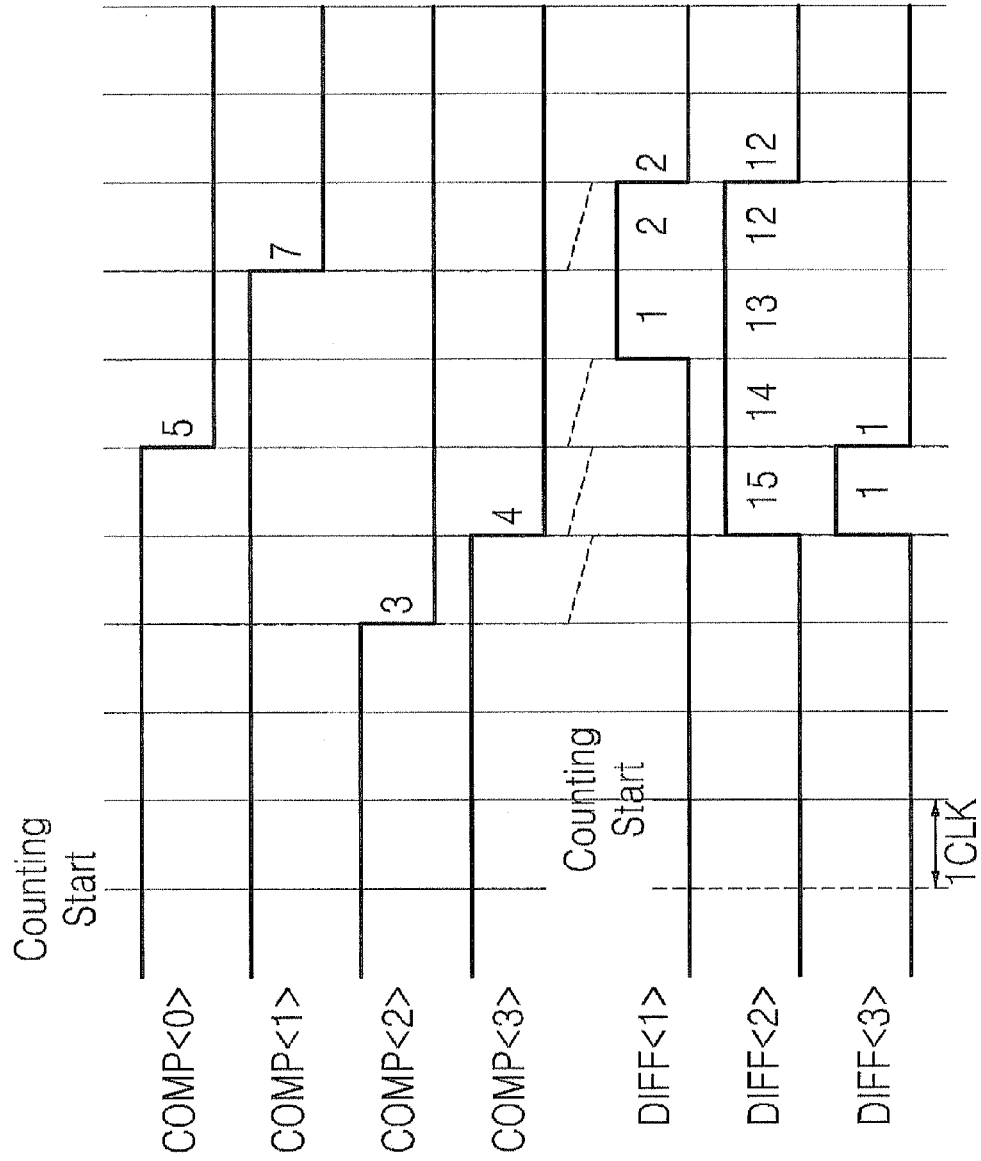
FIG. 6 is a diagram illustrating a counting operation according to some embodiments of the present invention.

FIG. 6 is a diagram illustrating a counting operation according to some embodiments of the present invention. The operation illustrated in FIG. 6 may be performed by the counter block illustrated in FIG. 5B and is based on the concept illustrated in FIG. 4.

When a conventional counter is used, data values are 5, 7, 3, and 4 for first through fourth columns #0 through #3, respectively. According to the current embodiments of the present invention, data values for the respective first through fourth columns #0 through #3 are read as 5, 2, 12, and 1, respectively, because after the first column #0 is read, a data value difference between two adjacent columns is read with respect to the adjacent columns, i.e., the second through fourth columns #1 through #3.

Here, since the data value for the third column #2 is represented by 12, it may be considered that the value shown in FIG. 6 is different from that shown in FIG. 4. However, since a 4-bit counter is used in the current embodiments, the value of 12 is substantially the same as the value of −4 on the basis 16 (i.e., the max count value before rollover).

As shown in Table 2, when counted data obtained according to the embodiments of the present invention are sequentially accumulated, the same values as the data values obtained when the conventional counter is used are obtained. At this time, an accumulation result for the third column #2 is 19, which is replaced by a result of ignoring an overflowing carry, i.e., 19−16=3.

TABLE 2

| Column # | 0 | 1 | 2 | 3 |
|---|---|---|---|---|
| Conventional counter | 5 | 7 | 3 | 4 |
| Difference counter | 5 | 2 | 12 | 1 |
| Reconstruction | = | 5 + 2 | 7 + 12 = 19 <br> 19 − 16 = 3 | 3 + 1 |
|  | 5 | 7 | 3 | 4 |

In detail, referring to FIG. 6, data COMP<0> through COMP<3> respectively input to the first flip-flops 511, 521, 531, and 541 corresponding to the respective first through fourth columns #0 through #3 have digital values of 5, 7, 3, and 4. A conventional counter block counts these values as they are. However, according to the embodiments of the present invention, the counter block illustrated in FIG. 5B counts data of only one column, i.e., the first column #0, and counts only a data difference between a current column and a previous column using an XOR operation with respect to each of the other columns, i.e., the second through fourth columns #1 through #3. At this time, a sign is detected by the second flip-flops 527, 537, and 547 A positive sign (i.e., "+") is detected when the data of the current column is logic high, and a negative sign (i.e., "−") is detected when the data of the current column is logic low. As shown in FIG. 5B, the output of flip-flops 527, 537 and 547 control whether up or down counting is performed by the counting units 525, 535 and 545, respectively.

For instance, after the data of the first column #0 is counted, when the first column #0 and the second column #1 are XORed for the second column #1, a value of +2 is obtained through "COMP<0> XOR COMP<1>". When the second column #1 and the third column #2 are XORed for the third column #2, a value of 12 is obtained through "COMP<1> XOR COMP<2>". When the third column #2 and the fourth column #3 are XORed for the fourth column #3, a value of +1 is obtained through "COMP<2> XOR COMP<3>".

Accordingly, the results shown in Table 2 are obtained. Graphs DIFF<1> through DIFF<3> may correspond to results of the XOR operation performed with respect to the first through fourth columns #1 through #3, respectively. The graphs DIFF<1> through DIFF<3> lag one clock cycle behind COMP<1> through COMP<3> because the first latches 512, 522, 532, and 542 and the second latches 513, 523, 533, and 543 delay a signal by ½ clock cycle.

Figure 7:
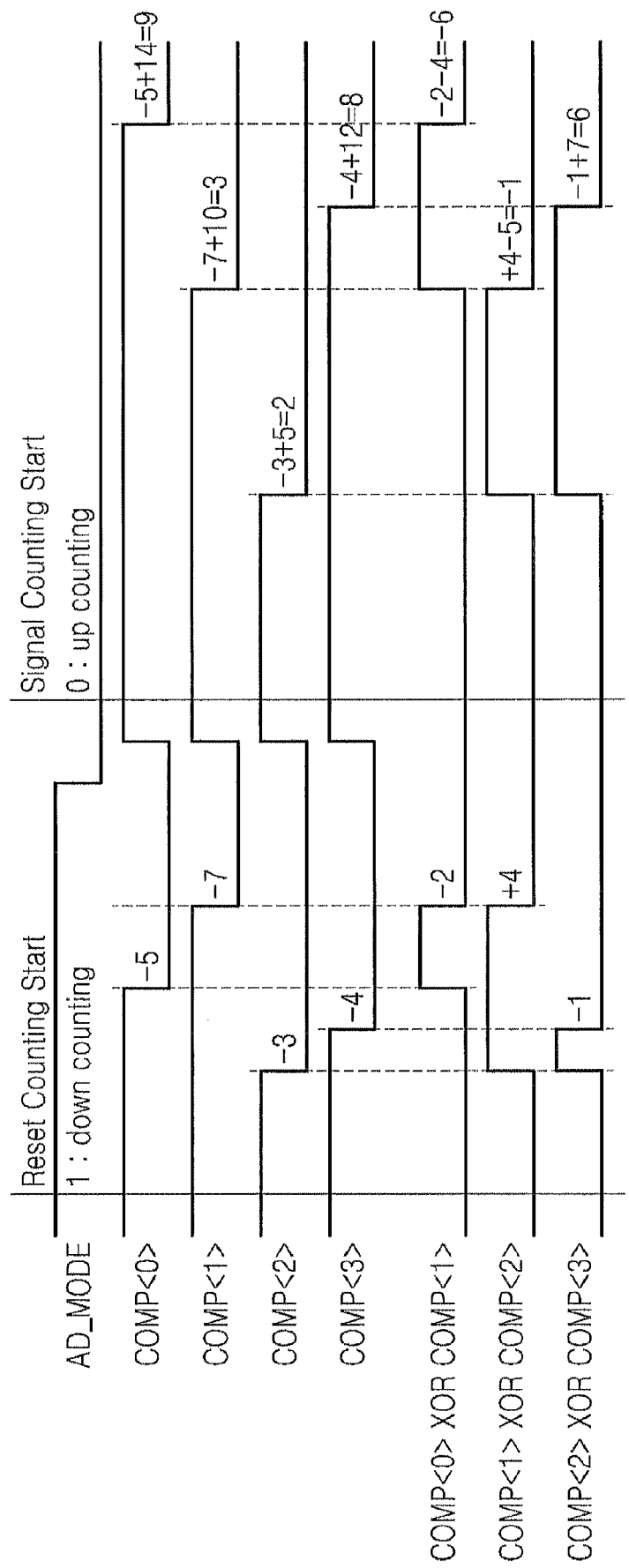
FIG. 7 is a graph provided to conceptually explain reset signal counting and image signal counting according to some embodiments of the present invention.

FIG. 7 is a graph provided to conceptually explain reset signal counting and image signal counting according to some embodiments of the present invention. The values discussed are for conceptual purposes, and not actual values generated by the circuits of the present invention. Instead these actual values will be discussed with respect to FIG. 9. The concepts of this embodiment involve an operation mode, which indicates whether to perform down counting for a reset read operation and up counting for an image signal read operation, via an operation mode signal AD_MODE. Referring to FIG. 7, according to an operation mode signal AD_MODE of the counter block 150', down counting is performed during first reading (i.e., reset signal counting) and up counting is performed during second reading (i.e., image signal counting). Accordingly, as described above, when two count values, i.e., a result of the reset signal counting (hereinafter, referred to as a "reset signal count value") and a result of the image signal counting (hereinafter, referred to as an "image signal count value") are added, substantially a result of subtracting the reset signal count value from the image signal count value is obtained. This will be described in detail with reference to Table 3.

TABLE 3

| Column # | | 0 | 1 | 2 | 3 |
|---|---|---|---|---|---|
| Conventional Counter | Reset | −5 | −7 | −3 | −4 |
| | Signal | 14 | 10 | 5 | 12 |
| | Result | 9 | 3 | 2 | 8 |
| Difference Counter | Reset | −5 | −2 | 4 | −1 |
| | Signal | 14 | −4 | −5 | 7 |
| | Result | 9 | −6 | −1 | 6 |
| Reconstruction | | = | 9 − 6 | 3 − 1 | 2 + 6 |
| | | 9 | 3 | 2 | 8 |

Referring to Table 3, when reset signals for respective first through fourth columns #0 through #3 and image signals for the respective first through fourth columns #0 through #3 are counted using conventional counters, reset signal count values of 5, 7, 3, and 4 and image signal count values of 14, 10, 5, and 12 are obtained. Since the reset signals are counted using down counting, the negative sign, i.e., "−" is added to the front of the reset signal count values. Accordingly, when the reset signal count value and the image signal count value are respectively added, values of 9, 3, 2, and 8 are obtained.

Differently, when the reset signals are counted according to some embodiments of the present invention, reset signal count values of 5, 2, −4, and 1 are obtained, which has been already described above with respect to Table 1. Since the reset signals are counted using down counting, the negative sign, i.e., "−" is added to the front of the reset signal count values in Table 3, so that values of −5, −2, 4, and −1 are obtained. When the image signals are counted according to the embodiments of the present invention, image signal count values of 14, −4, −5, and 7 are obtained in the same manner as the reset signal count values. Accordingly, when the reset signal count values and the image signal count values are respectively added for the first through fourth columns #0 through #3, result values of 9, −6, −1, and 6 are obtained. When the result values are sequentially accumulated for adjacent columns, the same values of 9, 3, 2, and 8 as the results of conventional counters are obtained.

Referring back to FIG. 7, FIG. 7 shows the content of Table 3 in graph form. When data COMP<0> through COMP<3> respectively input to counters corresponding to the respective first through fourth columns #0 through #3 are counted, reset signal count values are −5, −7, −3 and −4 since down counting is performed. Image signal count values are obtained through up counting and are added to the reset signal count values, respectively, so that result values are 9 (=−5+14), 3 (=−7+10), 2(−3+5), and 8 (=−4+12).

According to the embodiments of the present invention, a counter block counts data of only one column and then counts only data differences between a current column and a previous column using an XOR operation with respect to the other columns.

For instance, after the data of the first column #0 is counted, when the first column #0 and the second column #1 are XORed for the second column #1, through "COMP<0> XOR COMP<1>" a value of −2 is obtained for a reset signal and a value of −6 (=−2-4) is obtained for a result value that adds an image signal and the reset signal. When the second column #1 and the third column #2 are XORed for the third column #2, through "COMP<1> XOR COMP<2>" a value of 4 is obtained for a reset signal and a value of −1 (=+4-5) is obtained for a result value that adds an image signal and the reset signal. When the third column #2 and the fourth column #3 are XORed for the fourth column #3, through "COMP<2> XOR COMP<3>" a value of −1 is obtained for a reset signal and a value of 6 (=−1+7) is obtained for a result value that adds an image signal and the reset signal. A counter block related with the above-described method is illustrated in FIG. 8.

FIG. 8 is a detailed diagram of a counter block counting using data difference according to other embodiments of the present invention. FIG. 8 shows counters 810 through 840 respectively corresponding to first through fourth columns #0 through #3. The counters 810 through 840 are connected to each other as shown in FIG. 8.

The counter 810 for the first column #0 includes a first flip-flop 811, a first latch 812, a second latch 813, an AND gate 814, and a counting unit 815. The counter 820 for the second column #1 includes a first flip-flop 821, a first latch 822, a second latch 823, an AND gate 824, a counting unit 825, a first XOR gate 826, a second flip-flop 827, and a second XOR gate 828. The counter 830 for the third column #2 includes a first flip-flop 831, a first latch 832, a second latch 833, an AND gate 834, a counting unit 835, a first XOR gate 836, a second flip-flop 837, and a second XOR gate 838. The counter 840 for the fourth column #3 includes a first flip-flop 841, a first latch 842, a second latch 843, an AND gate 844, a counting unit 845, a first XOR gate 846, a second flip-flop 847, and a second XOR gate 848.

The first flip-flops 811, 821, 831, and 841 respectively receive comparator outputs COMP<0> through COMP<3> input to the respective counters 810, 820, 830, and 840 and respectively synchronize them in time domain. The second flip-flops 827, 837, and 847 are provided to detect a counting sign, i.e., +(positive) or − (negative). The first latches 812, 822, 832, and 842 and the second latches 813, 823, 833, and 843 delay an input signal by ½ clock cycle to provide a clear sign for each column, but the present invention is not restricted thereto.

The operation of the AND gates 814, 824, 834, and 844, the operation of the first XOR gates 826, 836, and 846, and the operation of the second XOR gates 828, 838, and 848 will be described below. The operations of the counters 810 and 820 respectively for the first and second columns #0 and #1 will only be described since the operations of the counters 820, 830, and 840 respectively for the second through fourth columns #1 through #3 are the same.

The first flip-flops 811 and 821 receive data COMP<0> and COMP<1>, respectively, output from comparators respectively connected to corresponding columns (i.e., the first and second columns #0 and #1) and receive a clock signal CLK. The first flip-flops 811 and 821 respectively synchronize the data COMP<0> and COMP<1> according to the clock signal CLK and the first latches 812 and 822 respectively delay the synchronized data COMP<0> and COMP<1> by ½ clock cycle.

In the counter 810 for the first column #0, the second latch 813 receives an output signal of the first latch 812 and the clock signal CLK, and delays the output signal of the first latch 812 by ½ clock cycle according to the clock signal CLK. The AND gate 814 receives an output signal of the second latch 813 and the clock signal CLK, and outputs the output signal of the second latch 813 when the clock signal CLK is at a logic high, so that the counting unit 815 counts the high value of the output signal of the second latch 813 according to the clock signal CLK.

When an operation mode signal AD_MODE input to the counting unit 815 from the counter controller is at a logic high, the counting unit 815 performs down counting. When the operation mode signal AD_MODE is at a logic low, the counting unit 815 performs up counting.

In the second counter 820 for the second column #1, the first XOR gate 826 performs a logic operation on the output signal of the first latch 812 and an output signal of the first latch 822. The logic operation has been described with reference to FIG. 7 above and will be described again with reference to FIG. 9 later.

The second flip-flop 827 receives the output signal of the first flip-flop 821 and an output signal of the first XOR gate 826 and detects a counting sign, i.e., + (positive or up) or − (negative or down). The second XOR gate 828 receives an output signal of the second flip-flop 827 and the operation mode signal AD_MODE, and outputs a signal to the counting unit 825 so that the counting unit 825 performs up counting when the output signal of the second flip-flop 827 and the operation mode signal AD_MODE have the same sign and performs down counting when the two signals have different signs.

The second latch 823 receives the output signal of the first XOR gate 826 and the clock signal CLK, and delays the output signal of the first XOR gate 826 by ½ clock cycle according to the clock signal CLK. The AND gate 824 receives an output signal of the second latch 823 and the clock signal CLK, and outputs the output signal of the second latch 823 when the clock signal CLK is at the logic high, so that the counting unit 825 counts the high value of the output signal of the second latch 823 according to the clock signal CLK.

Figure 9:
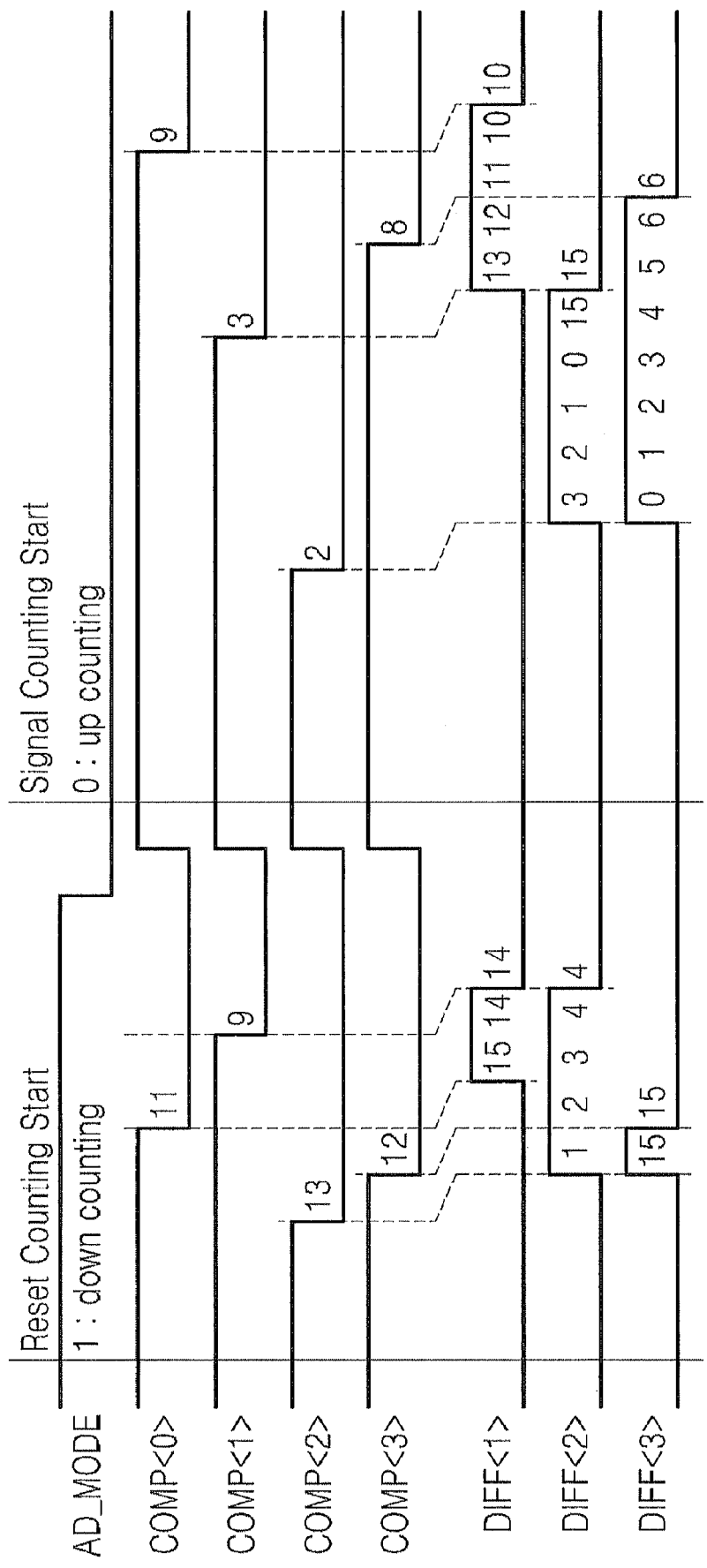
FIG. 9 is a diagram illustrating a counting operation according to other embodiments of the present invention.

FIG. 9 is a diagram illustrating a counting operation according to other embodiments of the present invention. The operation illustrated in FIG. 9 may be performed by the counter block illustrated in FIG. 8 and is based on the concept illustrated in FIG. 7.

When the data COMP<0> through COMP<3>, respectively input to counters corresponding to the first through fourth columns #0 through #3, are counted, reset signal count values are read as 11 (=16−5), 9 (=16−7), 13 (=16−3), and 12 (=16−4) by down counting. Image signal count values are read as 9, 3, 2, and 8 by up counting. At this time, each image signal count value is a result of adding a down counting result for a reset signal count value and an up counting result. Here, the counters are 4-bit counters, and therefore, the reset signal count values of 11, 9, 13, and 12 are substantially the same as the values of −5, −7, −3 and −4 described with reference to FIG. 7 because the basis is 16.

According to the embodiments of the present invention, a counter block counts data of only one column and then counts only a data difference between a current column and a previous column using an XOR operation with respect to the other columns. At this time, the sign does not change when the data of the current column is logic high and it changes when the data of the current column is logic low.

For instance, after the data of the first column #0 is counted, when the first column #0 and the second column #1 are XORed for the second column #1, a DIFF<1> (COMP<0> XOR COMP<1>) value of 14 (=16−2) is obtained for a reset signal and a DIFF<1> value of 10 (=14−4) is obtained for a result value that adds an image signal and the reset signal. When the second column #1 and the third column #2 are XORed for the third column #2, a DIFF<2> (COMP<1> XOR COMP<2>) value of 4 is obtained for a reset signal and a DIFF<2> value of −1 (=+4−5), i.e., 15 (=16−1) is obtained for a result value that adds an image signal and the reset signal. When the third column #2 and the fourth column #3 are XORed for the fourth column #3, a DIFF<3> (COMP<2> XOR COMP<3>) value of 15 (=16−1) is obtained for a reset signal and a DIFF<3> value of 6 (=−1+7) is obtained for a result value that adds an image signal and the reset signal.

Table 4 is composed based on the counting method illustrated in FIG. 9. When counted data obtained according to the current embodiments of the present invention are sequentially accumulated by the accumulator 185, the same values are obtained as when conventional counters are used. At this time, an accumulation result for the second column #1 is 19, which is replaced by a result of ignoring an overflowing carry, i.e., 19−16=3 and an accumulation result for the third column #2 is 18, which is replaced by a result of ignoring an overflowing carry, i.e., 18−16=2.

TABLE 4

| Column # | 0 | 1 | 2 | 3 |
|---|---|---|---|---|
| Conventional counter | 9 | 3 | 2 | 8 |
| Difference counter | 9 | 10 | 15 | 6 |
| Reconstruction | = | 9 + 10 = 19 | 3 + 15 = 18 | 2 + 6 |
|  |  | 19 − 16 = 3 | 18 − 16 = 2 |  |
|  | 9 | 3 | 2 | 8 |

Figure 10:
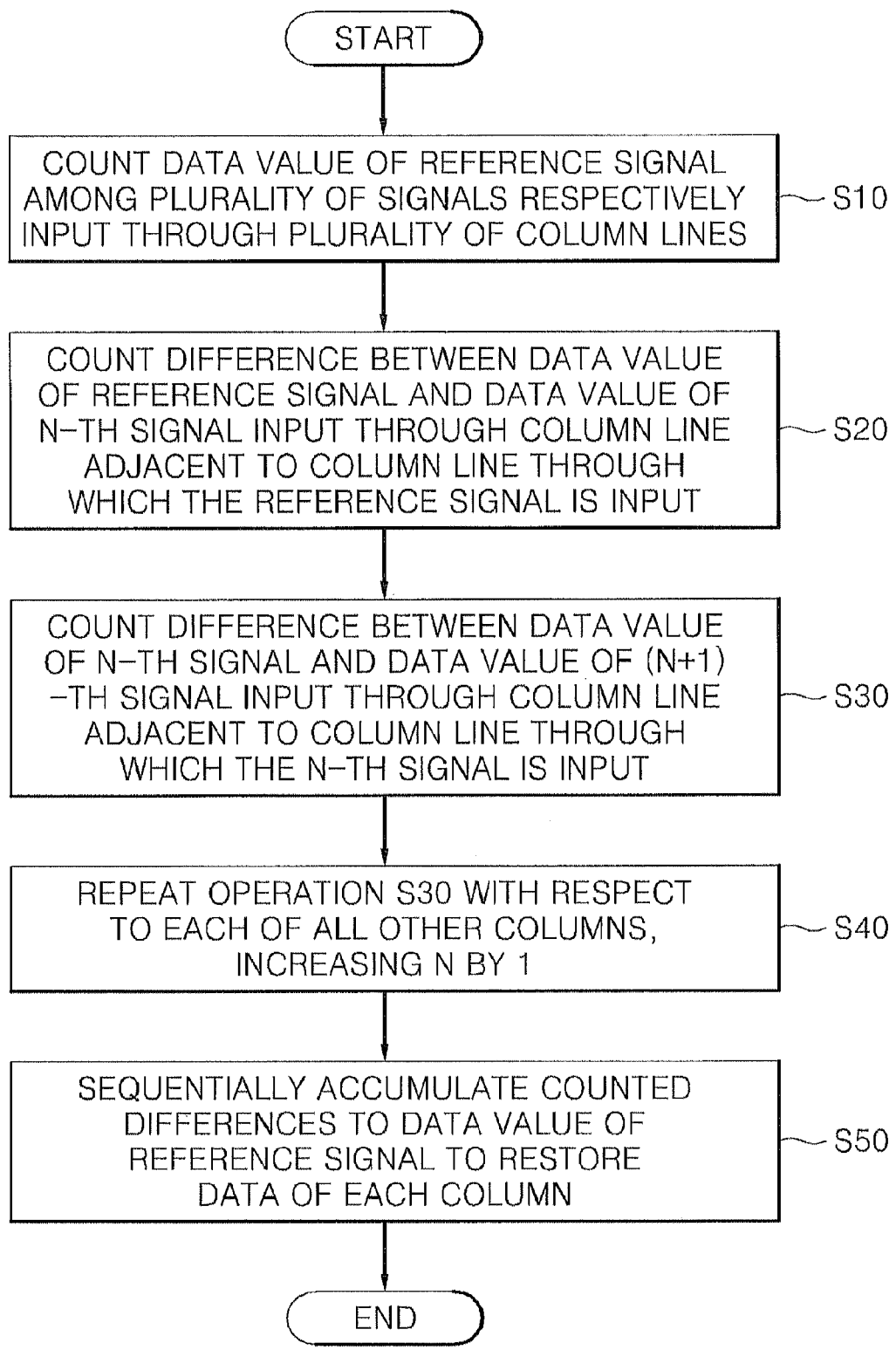
FIG. 10 is a flowchart of a data processing method according to some embodiments of the present invention.

FIG. 10 is a flowchart of a data processing method according to some embodiments of the present invention. The data processing method may be performed by the counter block illustrated in FIG. 5A, 5B, or 8. Here, it is assumed that the method is performed by the counter block illustrated in FIG. 8.

Referring to FIG. 10, the counter 810 counts a data value of a reference signal among a plurality of signals respectively input through a plurality of column lines to the counter block in operation S10. The reference signal is a signal input through a reference column line among the plurality of column lines. The reference column line may be any one column among the plurality of column lines. For instance, the reference column may a first column line or a tenth column line.

The counter 820 counts a difference between the data value of the reference signal and a data value of an N-th signal input through a column line adjacent to the reference column line in operation S20. At this time, N is 1 or an integer greater than 1. Here, an "adjacent" column may be a column right beside a reference column or a column a desired (or, alternatively a predetermined) distance, e.g., a predetermined integer, away from the reference column.

The counter 830 counts a difference between the data value of the N-th signal and a data value of an (N+1)-th signal input through a column line adjacent to the column line through which the N-th signal is input in operation S30. The counter 840 and the other remaining counters not shown in FIG. 8 perform the same operation as operation S30 in operation S40. In other words, the counter block repeats operation S30 with respect to each of all other columns, increasing N by 1. All counted differences are sequentially accumulated to the data value of the reference signal one by one to restore data of each column in operation S50.

As described above, according to some embodiments of the present invention, instead of counting a data value of each signal, only a difference between data values of adjacent signals is counted, thereby reducing power consumption of a counter.

Figure 11:
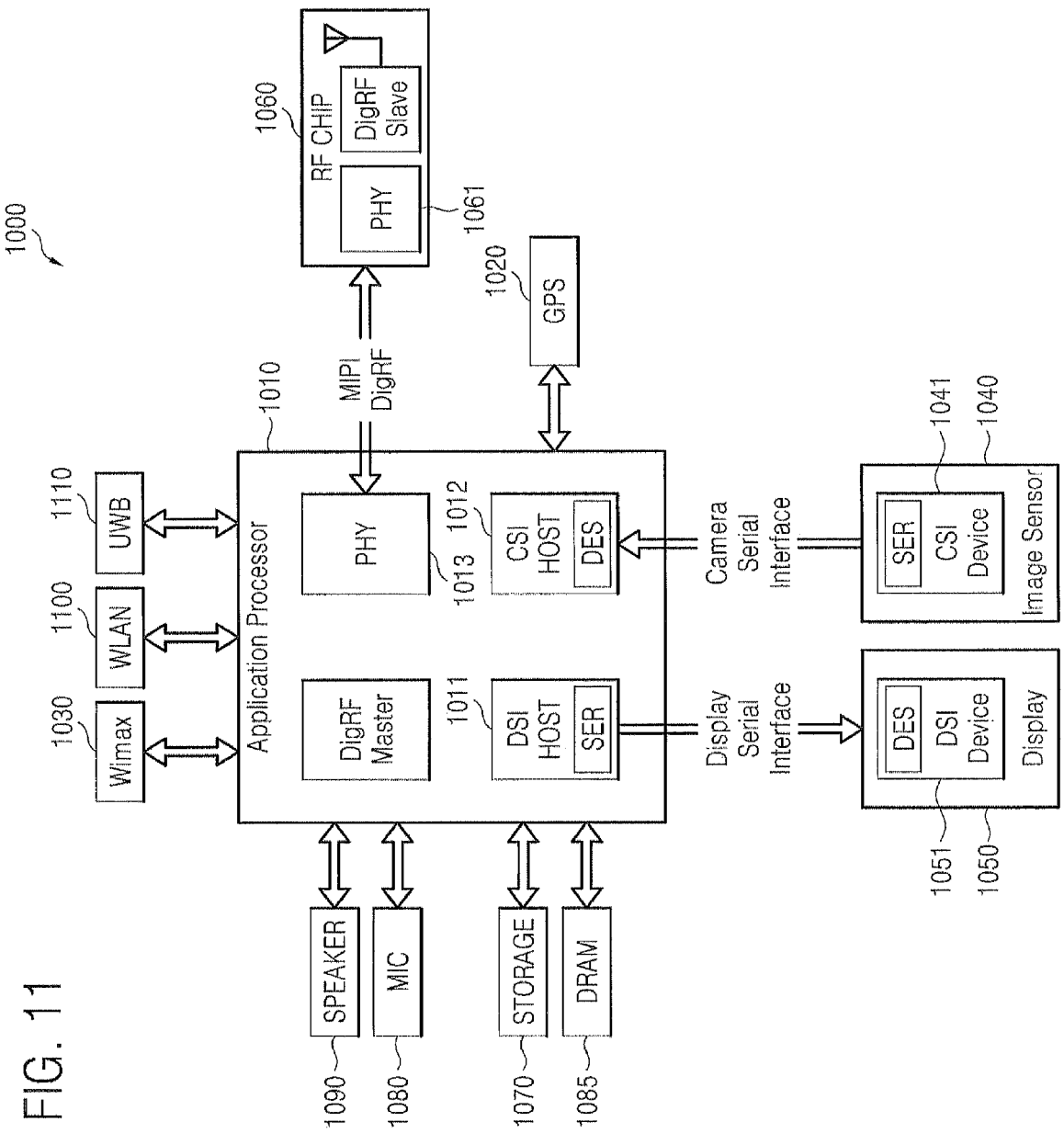
FIG. 11 is a block diagram of an electronic system including an image sensor according to some embodiments of the present invention.

FIG. 11 is a block diagram of an electronic system 1000 including an image sensor according to some embodiments of the present invention. The electronic system 1000 may be implemented in a data processing device, such as a mobile phone, a personal digital assistant (PDA), a portable media player (PMP), or a smart phone, which can use or support mobile industry processor interface (MIPI). The electronic system 1000 includes an application processor 1010, an image sensor 1040, and a display 1050. The image sensor 1040 may be implemented according to any of the above-described embodiments.

A camera serial interface (CSI) host 1012 implemented in the application processor 1010 can perform serial communication with a CSI device 1041 included in the image sensor 1040 through the CSI. At this time, an optical deserializer and an optical serializer may be implemented in the CSI host 1012 and the CSI device 1041, respectively.

A display serial interface (DSI) host 1011 implemented in the application processor 1010 can perform serial communication with a DSI device 1051 included in the display 1050 through the DSI protocol. At this time, an optical serializer and an optical deserializer may be implemented in the DSI host 1011 and the DSI device 1051, respectively.

The electronic system 1000 may also include a radio frequency (RF) chip 1060 communicating with the application processor 1010. A physical layer (PHY) 1013 of the application processor 1010 and a PHY 1061 of the RF chip 1060 can communicate data with each other according to MIPI DigRF.

The electronic system 1000 may further include a global positioning system (GPS) 1020, a storage 1070, a microphone (MIC) 1080, a dynamic random access memory (DRAM) 1085, and a speaker 1090. The electronic system 1000 may communicate using a Worldwide interoperability for microwave access (Wimax) 1030, a wireless local area network (WLAN) 1100, and an ultra-wideband (UWB) 1110.

While the present invention has been particularly shown and described with reference to exemplary embodiments thereof, it will be understood by those of ordinary skill in the art that various changes in forms and details may be made therein without departing from the spirit and scope of the present invention as defined by the following claims. For example, while the counters in the various embodiments were described as 4-bit counters, the present invention is not limited to this. Instead, for example, greater than 4-bit counters, such as 11, 13, etc., bit counters may be used. Also, while difference counting based on four columns was discussed, the difference counting may be performed for more than four columns.

We claim:

1. A counter circuit associated with a pixel array, comprising:
   a plurality of counting circuits, each counting circuit configured to receive an associated input signal, each input signal associated with a different column of the pixel array;
   a first of the plurality of counting circuits configured to count based on the associated input signal;
   each subsequent counting circuit in the plurality of counting circuits configured to count based on a difference between the associated input signal and the input signal associated with a preceding counting circuit.

2. The counter circuit of claim 1, wherein
   the first of the plurality of counting circuits includes a first counter counting based on the associated input signal;
   each subsequent counting circuit includes,
      a difference circuit configured to identify a difference between the associated input signal and the input signal associated with the preceding counting circuit, and
      a second counter configured to count based on output of the difference circuit.

3. The counter circuit of claim 2, wherein
   the plurality of counting circuits receive output from associated comparators as the associated inputs signals; and
   each subsequent counting circuit includes,
      a synchronizing circuit configured to quantize the associated input signal,
      a delay circuit configured to delay the associated input signal output from the synchronizing circuit; and
   the difference circuit is configured to identify a difference between the delayed associated input signal and the delayed input signal associated with the preceding counting circuit.

4. The counter circuit of claim 2, wherein each subsequent counting circuit includes a count direction determining circuit configured to control whether the second counter counts up or down based on the associated input signal and the output of the difference circuit.

5. The counter circuit of claim 4, wherein each count direction determining circuit includes a register configured to stored the associated input signal based on the output of the difference circuit.

6. The counter circuit of claim 4, wherein each count direction determining circuit comprises:
   a register configured to stored the associated input signal based on the output of the difference circuit; and
   an exclusive OR gate configured to receive output of the register and a mode signal as inputs, the mode signal indicating whether the operation mode is one of a pixel reset counting mode and an image signal counting mode.

7. The counter circuit of claim 4, wherein
the plurality of counting circuits are configured to receive output from associated comparators as the associated inputs signals; and
the difference circuit includes an exclusive OR gate configured to receive the associated input signal and the input signal associated with the preceding counting circuit.

8. The counter circuit of claim 4, wherein the difference circuit includes an exclusive OR gate configured to receive the associated input signal and the input signal associated with the preceding counting circuit.

9. The counter circuit of claim 3, wherein each subsequent counting circuit includes a count direction determining circuit configured to control whether the second counter counts up or down based on the quantized associated input signal and the output of the difference circuit.

10. The counter circuit of claim 9, wherein each count direction determining circuit includes a register configured to store the quantized associated input signal based on the output of the difference circuit.

11. The counter circuit of claim 9, wherein each count direction determining circuit comprises:
a register configured to store the quantized associated input signal based on the output of the difference circuit; and
an exclusive OR gate configured to receive output of the register and a mode signal as inputs, the mode signal indicating whether the operation mode is one of a pixel reset counting mode and an image signal counting mode.

12. The counter circuit of claim 9, wherein
the plurality of counting circuits are configured to receive output from associated comparators as the associated inputs signals; and
the difference circuit includes an exclusive OR gate configured to receive the delayed associated input signal and the delayed input signal associated with the preceding counting circuit.

13. The counter circuit of claim 9, wherein the difference circuit includes an exclusive OR gate configured to receive the delayed associated input signal and the delayed input signal associated with the preceding counting circuit.

14. An analog-to-digital converter (ADC) associated with a pixel array having pixels arranged in a plurality of columns, comprising:
a counter circuit configured to receive input signals, each of the input signals associated with a different one of the plurality of columns, the counter circuit configured to generate a count value associated with each input signal during first and second read operations, the first read operation reading reset states for the plurality of columns, and the second read operation reading image signals from the plurality of columns;
the counter circuit configured such that at least one count value associated with one of the plurality of columns represents a difference between a digital value representing the received input signal for the associated column and a digital value representing the received input signal for one of the plurality of columns adjacent to the associated column.

15. The ADC of claim 14, wherein the counter circuit is configured to receive a mode signal indicating whether an operation mode is one of the first read operation and the second read operation.

16. The ADC of claim 15, wherein the counter circuit is configured to one of count up and count down based on the mode signal.

17. The ADC of claim 16, wherein the counter circuit comprises:
a plurality of counting circuits, each counting circuit associated with and configured to receive a different one of the input signals, and each counting circuit configured to one of count up and count down based on the mode signal;
a first of the plurality of counting circuits configured to count based on the associated input signal;
each subsequent counting circuit in the plurality of counting circuits configured to count based on a difference between the associated input signal and the input signal associated with a preceding counting circuit.

18. The ADC of claim 17, wherein
the first of the plurality of counting circuits includes a first counter counting based on the associated input signal;
each subsequent counting circuit includes,
a difference circuit configured to identify a difference between the associated input signal and the input signal associated with the preceding counting circuit, and
a second counter configured to count based on output of the difference circuit.

19. The ADC of claim 18, wherein each subsequent counting circuit includes a count direction determining circuit configured to control whether the second counter counts up or down based on the associated input signal and the output of the difference circuit.

20. The ADC of claim 19, wherein each subsequent counting circuit includes a count direction determining circuit configured to control whether the second counter counts up or down based on the associated input signal, the output of the difference circuit and a mode signal, the mode signal indicating whether an operation mode is one of the first read operation and the second read operation.

21. An analog-to-digital converter (ADC) associated with a pixel array having pixels arranged in a plurality of columns, comprising:
a comparator circuit configured to generate comparison signals associated with the plurality of columns by comparing output from the plurality of columns to a ramp signal during a first read operation and during a second read operation, the first read operation reading reset states for the plurality of columns, and the second read operation reading image signals from the plurality of columns;
a counter circuit including a plurality of counting circuits, each counting circuit associated with a different one of the plurality of columns and configured to receive the comparison signal corresponding to the associated column, the counter circuit configured to enable at least one of the counting circuits to count a difference between the comparison signal corresponding to the associated column and the comparison signal corresponding to a column adjacent to the associated column.

22. The ADC of claim 21, wherein
the first of the plurality of counting circuits includes a first counter counting based on the associated comparison signal;
each subsequent counting circuit includes,
a difference circuit configured to identify a difference between the associated comparison signal and the comparison signal associated with the preceding counting circuit, and a second counter configured to count based on output of the difference circuit.

23. The ADC of claim 22, wherein each subsequent counting circuit includes a count direction determining circuit configured to control whether the second counter counts up or down based on the associated comparison signal and the output of the difference circuit.

24. The ADC of claim 23, wherein each subsequent counting circuit includes a count direction determining circuit configured to control whether the second counter counts up or down based on the associated comparison signal, the output of the difference circuit and a mode signal, the mode signal indicating whether an operation mode is one of the first read operation and the second read operation.

25. The ADC of claim 22, wherein each subsequent counting circuit includes,
- a synchronizing circuit configured to quantize the associated comparison signal,
- a delay circuit configured to delay the associated comparison signal output from the synchronizing circuit; and
- the difference circuit is configured to identify a difference between the delayed associated comparison signal and the delayed comparison signal associated with the preceding counting circuit.

26. The ADC of claim 25, wherein each subsequent counting circuit includes a count direction determining circuit configured to control whether the second counter counts up or down based on the quantized associated comparison signal and the output of the difference circuit.

27. The ADC of claim 26, wherein each subsequent counting circuit includes a count direction determining circuit configured to control whether the second counter counts up or down based on the quantized associated comparison signal, the output of the difference circuit and a mode signal, the mode signal indicating whether an operation mode is one of the first read operation and the second read operation.

28. An image sensor, comprising:
- a pixel array having pixels arranged in a plurality of columns;
- a comparator circuit configured to generate comparison signals associated with the plurality of columns by comparing output from the plurality of columns to a ramp signal during a first read operation and during a second read operation, the first read operation reading reset states for the plurality of columns, and the second read operation reading image signals from the plurality of columns;
- a counter circuit including a plurality of counting circuits, each counting circuit associated with a different one of the plurality of columns and configured to receive the comparison signal corresponding to the associated column, the counter circuit configured to enable at least one of the counting circuits to count a difference between the comparison signal corresponding to the associated column and the comparison signal corresponding to a column adjacent to the associated column.

29. The image sensor of claim 28, further comprising:
a control register configured to interface with an image processor.

30. The image sensor of claim 29, wherein the control registers is configured to interface with the image processor via the inter-integrated circuit communication protocol.

* * * * *